United States Patent

Forster et al.

[15] 3,639,186

[45] Feb. 1, 1972

[54] PROCESS FOR THE PRODUCTION OF FINELY ETCHED PATTERNS

[72] Inventors: Theodor Forster, Thalwil, Zurich; Theodor O. Mohr, Gattikon, Zurich, both of Switzerland

[73] Assignee: International Business Machines Corporation, Armonk, N.Y.

[22] Filed: Feb. 24, 1969

[21] Appl. No.: 801,519

[52] U.S. Cl. ....................156/17, 29/569, 148/187

[51] Int. Cl. ....................H01l 7/50, H01l 7/44

[58] Field of Search ....................156/13, 17; 29/569; 148/187

[56] References Cited

UNITED STATES PATENTS

| | | | |
|---|---|---|---|
| 3,025,589 | 3/1962 | Hoerni | 156/17 UX |
| 3,366,520 | 1/1968 | Berkenblit et al. | 156/17 |

*Primary Examiner*—Jacob H. Steinberg

*Attorney*—Hanifin and Jancin and T. J. Kilgannon, Jr.

[57] ABSTRACT

A method for fabricating finely etched patterns is disclosed. The steps include the etching of closely spaced windows in an oxide layer ($SiO_2$) which covers the surface of a semiconductor substrate. The substrate with the exposed semiconductor is then subjected to vapor etching which undercuts the oxide at the interface between the oxide and the semiconductor. The original exposed semiconductor area is enlarged as a result and the spacing between windows narrowed to dimensions not attainable using ordinary photolithographic techniques. By subsequently masking the exposed semiconductor surface with a material which does not dissolve in an etchant for the oxide and etching the oxide, the oxide can be removed forming an exposed region on the semiconductor surface which is extremely narrow. A method for fabricating a Schottky barrier field effect transistor is also disclosed.

6 Claims, 9 Drawing Figures

INVENTORS
THEODOR FORSTER
THEODOR O. MOHR
BY Thomas J. Kilgannon Jr.
ATTORNEY

PROCESS FOR THE PRODUCTION OF FINELY ETCHED PATTERNS

BACKGROUND OF THE INVENTION

1. Field of the Invention

This invention relates generally to etching processes useful in the fabrication of semiconductor devices. More specifically, it relates to a process which provides finely etched patterns or exposed surfaces of a semiconductor substrate of higher resolution than obtainable by known photolithographic techniques.

2. Description of the Prior Art

In the field of telecommunications and data processing, there is an interest for continuously increasing working frequencies and consonant therewith, pulse frequencies of the equipment. This interest leads to experiments to employ semiconductor elements for the processing of these signals, which have particularly low inductances, capacitances and carrier life-times. This results in a requirement to reduce as far as possible certain geometric dimensions of the elements, e.g., the channel length of field-effect transistors. Attempts to construct very small semiconductor elements are meeting various difficulties. In planar technology, widely used today, in which a large number of similar elements or similar circuits are produced on a single substrate of semiconductor material, masking processes are being used extensively during manufacture. As an example, the semiconductor surface is covered with an insulating layer, e.g., semiconductor oxide. This layer is covered with a photoresist, which has the property that it is soluble in a subsequent process step in portions where it has been exposed to light or vice versa. In further procedural steps like etching, diffusion, cathode sputtering, vacuum deposition, galvanic deposition etc., portions of the substrate at which the photoresist had been removed are being worked upon. The projection of very fine patterns becomes difficult because of the appearance of diffraction-fringes from narrow optical slots. Furthermore, for contact masking as well as for mask-projection, the surface has to be extremely planar for maximum definition. In the manufacture of semiconductor elements, a series of procedural steps is normally employed which often requires repetitive application of masks. To obtain precise geometric dimensions, it is required that subsequent masks are registered with high precision. Working in the dimensions envisioned, this requirement is quite difficult to meet.

Other relevant art includes fabrication techniques for semiconductor devices which show the etching and undercutting of a semiconductor material and the subsequent deposition of eptiaxially deposited layers of semiconductor material in the cavities thus formed. All the known prior art uses techniques which substantially attack the underlying semiconductor without affecting the overlying protective oxide. This is opposed to the present technique wherein the oxide at the interface between the oxide and the underlying semiconductor is attacked without substantially attacking the semiconductor.

SUMMARY OF THE INVENTION

The present invention in its broader aspect relates to etching processes for fabricating finely etched patterns or stripes in oxides disposed on the surface of a semiconductor substrate. The method provides for the formation of closely spaced apertures in a metal oxide layer; etching an oxide region of given width at its interface with the semiconductor substrate to reduce its width; masking the thus exposed surface and the originally exposed surface of the substrate with a material which is insoluble in an etchant for the oxide and; removing the oxide region to produce an exposed substrate surface of width smaller than the given width.

In accordance with a more specific aspect of the invention, a method of fabricating a Schottky barrier field effect transistor is provided in which a layer of doped semiconductor material is simultaneously deposited during the etching step which causes undercutting of the metal oxide layer. The depositing is halted prior to the halting of the etching step to provide a free space between the undercut oxide portion and the epitaxially deposited layer. After etching is halted, contacts are formed on the eptiaxially deposited layer. During this step, overhanging edges of the oxide produced during etching act to mask the exposed areas of the substrate and a portion of the epitaxially deposited layer. The resulting contacts have areas substantially equal to the area of the apertures initially formed in the oxide. After the region with the apertures has been masked and the oxide region has been removed, a gate contact is provided by deposition of a metal contact material. The masking material which was previously deposited so the oxide region could be removed is now removed by etching through the metallic contact material. The contact material remains and is subsequently mechanically removed. Interconnection leads are then applied to the contact area.

The above outlined procedure allows the production of semiconductor elements having particularly small geometric dimensions. The width of a line of 3–5 $\mu$m. which may be produced by known photo resist technique, may be reduced to less than 1 $\mu$m. with the herein described procedure.

It is, therefore, an object of this invention to produce very small yet low priced semiconductor elements for integrated circuits.

Another object is to provide a process in which the mask surface extends over the desired dimension and is reduced subsequently by underetching sideways.

Another object is to provide a process for the production of semiconductor elements on a single-crystal substrate wherein an electrode pattern is produced by partial removal of a nonconductive layer on the substrate and wherein the line width of the pattern is reduced by underetching sideways of parts of the layer.

Yet another object is to provide a process in which, while the nonconductive layer is being underetched sideways, semiconductor material is being deposited concurrently in those places and in which the nonconductive layer has been removed or undereteched previously.

The foregoing and other objects, features and advantages of the present invention will be apparent from the following more particular description of preferred steps of the invention taken in conjunction with the accompanying drawings.

DESCRIPTION OF A PREFERRED EMBODIMENT

The inventive procedure shall now be described in detail and the manufacture of a silicon field-effect transistor with Schottky-barrier electrodes will be used as an example. In order to handle high frequencies, the transistor should have very small spacing between source and drain and, therefore, the gate electrode should be as narrow as possible. As noted already in the introduction, today's technology is somewhat limited. This is particularly true relative to the popular photomasking procedures which do not allow the production of very fine lines because of their limited resolution.

Figure 1A:
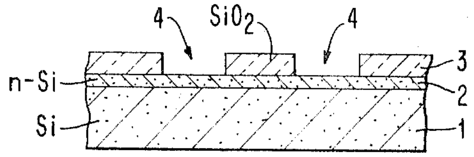
FIGS. 1A and 1B are a cross sectioned and top view, respectively, of a silicon substrate with windows etched in a covering oxide layer.

The procedure starts with a high resistivity, s single-crystal silicon substrate 1, as shown in FIG. 1A. The substrate is covered, by a well-known procedure, with an $n$-layer 2 of silicon of moderate conductivity of about 0.1–0.2 ohm-cm. and 0.5–1 μm. thickness. This layer provides the channel of the resulting field-effect transistor.

The substrate is then covered with oxide layer 3 which has 0.2–0.5 μm. thickness. This layer is produced in a well-known manner, e.g., in a steam atmosphere at 950° C. for 30–60 minutes. It has shown to be of advantage to subject the resulting $SiO_2$ to a stabilizing or drying operation in an atmosphere of argon or oxygen for 10 to 20 minutes at a temperature of 950° C. This operation however, is not absolutely necessary and may be omitted if desired.

Figure 1B:
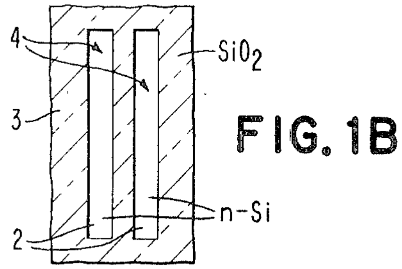

In a subsequent step, two windows having the dimensions, for example, 20×250 $\mu m.^2$ are opened by means of a photomask-and-etch procedure. Windows 4 will later contain the source and drain electrodes of the resulting field effect transistor. Windows 4 are shown in FIGS. 1A and 1B. Their separation should be as small as possible, e.g., 3 μm., in order to be able to delineate a gate region with a single underetching process.

Figure 2:
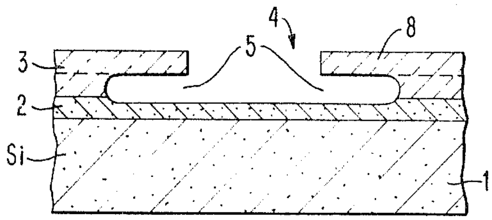
FIG. 2 is a cross-sectional view through a window in which an $SiO_2$ layer has been underetched sideways.

In a further step, the $SiO_2$ layer 3 is underetched in windows 4 sideways for 10 to 15 minutes at a temperature between 950° and 1,000° C. in an atmosphere of hydrogen or argon. It has been shown that in an atmosphere of the mentioned gases a removal of silicon dioxide and silicon occurs preferentially in places where the oxide and the metallic silicon are in contact. One of the resulting forms which is of particular interest is shown in FIG. 2 wherein removal of the oxide at the edge of the Si window occurs at the mentioned temperatures. The dashed line in FIG. 2 indicates the surface region of the oxide in which no notable removal takes place. In this way, protruding edges 8 of layer 3 are produced around the windows 4 of the oxide layer overhanging undercut region 5.

The effect of the preferential silicon and silicon dioxide etching at the edge of open windows has been mentioned already in literature, its usefulness however has not been noted. The effect is known as undesirable side effect in selective Si epitaxy. It is based on the following chemical reactions:

$$SiO_2+H_2 \rightarrow SiO+H_2O$$

$$Si+H_2O \rightarrow SiO+H_2$$

Also the direct reaction $$SiO_2+Si \rightarrow 2SiO$$

must be considered. The stabilization (drying) of the oxide at its surface and a reduced ability to react at low temperatures as well as large distance between Si and $SiO_2$ probably are the basis for a defined underetching without notable enlargement of the window. This effect is being employed usefully in this invention. It has been shown, that the amount of the sideways underetching may well be controlled. A depth of underetching of 1 μm. is obtained in 5 minutes and a depth of 4 μm. in about 20 minutes. The underetching of oxide layer 3 is advantageously done in an epitaxial reactor at temperatures between 950° and 1,000° C. The removal of the *n*-Si-layer remains so small, that it does not affect the construction of semiconductor elements as long as the exposed Si surface in the window is large enough. At more elevated temperatures e.g., above 1,150° C., an oxide layer of a thickness as relevant here, would be removed completely.

Figure 3A:
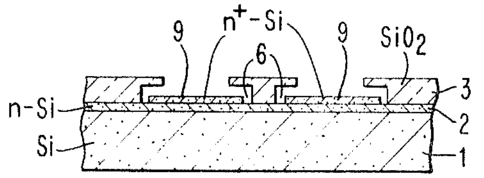
FIGS. 3A and 3B show an epitaxial deposition of $n^+$ silicon in the window and underneath the underetched $SiO_2$ layer.
Figure 3B:
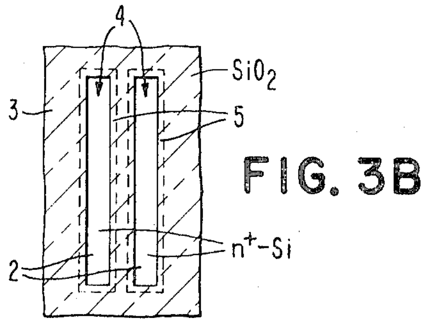

In the same step and concurrently with the etching which is made in flowing hydrogen or argon gas as has been noted, a layer of $n^+$ conductive silicon may be deposited epitaxially by well-known techniques in each of the apertures 4. By the addition of arsene, $AsH_3$, a thin doped layer 9 of silicon is produced having a specific resistance of about 0.01 ohm-cm. This highly conductive layer serves to reduce the series-resistances between source and drain electrode respectively and the gate electrode. Layers 9 of $n^+$-silicon can be seen in FIG. 3. It is advantageous to stop the epitaxy before stopping the underetching so that a small region 6 of low conductive *n*-silicon remains exposed underneath the protruding oxide layer as shown in FIG. 3. This expedient avoids breakdowns between the control electrode and the other electrodes.

Figure 4A:
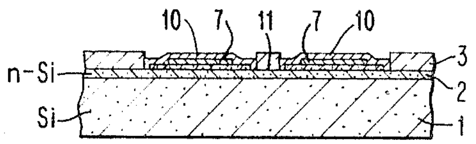
FIGS. 4A and 4B show deposited ohmic contacts and a nickel masking step.
Figure 4B:
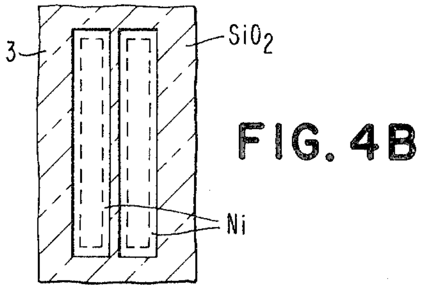

In a further step, ohmic contacts 7 are arranged for the source and drain zones on the surfaces inside windows 4 in the $SiO_2$. This is advantageously made by vacuum deposition and alloying of a suitable material like gold-antimony, (layer 7 shows in FIG. 4A). When vacuum depositing these contacts, the protruding oxide edges 8 serve as masks and electrode metal will not be deposited underneath these edges 8. In a further step the protruding edges 8 of the $SiO_2$ layer are removed. This can be done by simply wiping the substrate surface with a cotton tipped swab or similar tool or by subjecting the substrate in a liquid filled vessel to ultrasound, which causes the oxide edges 8 to break off. Alternatively, the $SiO_2$ may be etched, but only to the extent that the protruding edges 8 of the layer 3 are removed. On substrate 1, the electrodes S for source and D for drain are now arranged. The narrow strip 11 of oxide over the semiconductor region on which the gate electrode, G, is to be arranged is still covered with $SiO_2$. The spacing between the electrodes includes the oxide-free silicon surface portion 6.

In the following, the fabrication of the gate electrode G, which, in this example, is of the Schottky-barrier type, will be explained. First of all, the free spaces including layers 7, uncovered portions of layers 7 and 9 and portion 6 are covered up with a nickel mask 10. To achieve this, metallic nickel is deposited galvanically to a thickness of about 1,000 A. In this process, nickel does not deposit on the $SiO_2$ covered surfaces. In a subsequent step, a second photomask is produced which leaves uncovered the 1 μm. wide bridge of $SiO_2$ over strip 11 that remains between the two windows 4. This is the place in which the gate electrode G is to be produced. It is to be noted, that registration of this mask is quite uncritical, because all that matters is that the mentioned bridge remains free. Whether the nickel surfaces within the old windows remain free or are covered by the mask is unessential, because basically the mask only serves to delimit from each other the different transistors that have been made simultaneously on the same substrate.

The contact surface strip 11 of the gate electrode, that is, the original surface of the substrate with the overlying *n*-layer 2 for the channel, is now opened by etching the overlying $SiO_2$ with buffered HF. The metallic nickel layer 10, which covers the remaining parts of the transistor beyond the photo mask is not influenced by this etching.

In a further step, the Schottky-barrier contact is produced. As is already known, chrome-gold or another suitable contact material is deposited which now, however, is not alloyed into the silicon. Finally the photomask is removed and superfluous chrome-gold which has deposited on the top of the lacquer is wiped off.

In a further step, the metallic nickel which is now covering the source and drain zone as well as the area between source, drain and gate electrodes is etched away. This can be done by means of $HNO_3$ which only attacks the nickel and leaves intact the chrome-gold layers for the electrodes. Prior to this step, the nickel surface 10 was covered with chrome-gold, which had been deposited to produce the gate electrode G. The etching solution penetrates this layer and acts upon the nickel, because obviously the layers are not free of porosity. When the nickel is removed, the chrome-gold will remain and must be removed separately, e.g., wiped off.

Figure 5A:
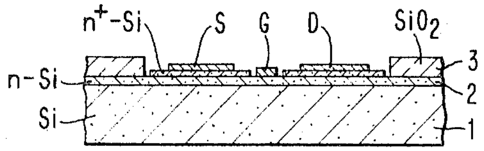
FIGS. 5A and 5B show complete Schottky-barrier field-effect transistor.
Figure 5B:
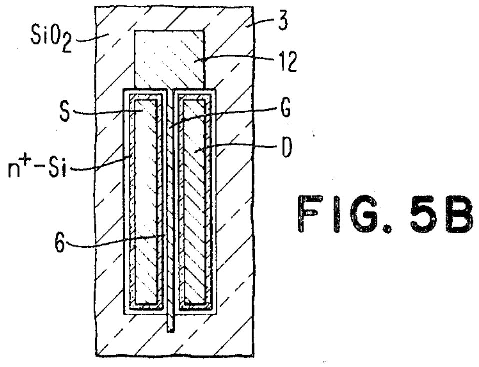

In a last step, the connection for the electrodes are reinforced galvanically, by known means, so that they may be bonded or otherwise connected to lines later on. The very narrow gate electrode G advantageously is provided with a contact land 12 (See FIG. 5B), which permits soldering or bonding a connection wire. Depending upon the size of the transistor, it may be necessary also to provide the source S and the drain D with such contact lands. The free surfaces of the transistor are now passivated e.g., by cathode sputtering of $SiO_2$ or any other known procedure.

Although the inventive procedure has been explained by means of the example of a Schottky-barrier field-effect transistor, numerous other applications and examples are obvious for those skilled in the art, e.g., the manufacture of Schottky-barrier field-effect transistors of other designs, the manufacture of bipolar transistors, or the manufacture of integrated circuits containing such elements. It is furthermore obvious, that the nickel-masking procedure mentioned in the latter part of this description may also be employed separately and independent of the underetching procedure mentioned in the first part.

While the invention has been particularly shown and described with reference to preferred method steps, it will be understood by those skilled in the art that various changes in details may be made thereof without departing from the spirit and scope of the invention.

What is claimed is:

1. A method for exposing very narrow regions at the surface of a silicon semiconductor substrate at least a portion of which has a protective coating of silicon oxide of given width disposed on its surface and at least an exposed surface portion comprising the steps of:

etching said oxide region at its interface with said semiconductor substrate by exposing said substrate to a temperature in the range of 950°–1,000° C. in an atmosphere of a gas selected from the group consisting of hydrogen and argon for a time sufficient to remove substantially only a portion of the oxide at its interface with said semiconductor substrate to reduce the width of said region and provide a newly exposed surface portion, masking said exposed surface portion and at least a portion of said newly exposed portion with a material which is insoluble in an etchant for said silicon oxide, and removing said silicon oxide region to produce an exposed substrate surface of width smaller than said given width.

2. A method for exposing very narrow regions at the surface of a silicon substrate having a protective coating of silicon dioxide on the surface thereof comprising the steps of:

forming at least two apertures in said coating the spacing therebetween being defined by a portion of said coating, undercutting at least said portion at the interface of said oxide and said substrate by exposing said substrate to a temperature in the range of 950°–1,000° C. in an atmosphere of a gas selected from the group consisting of hydrogen and argon for a time sufficient to remove only the silicon dioxide at its interface with said substrate to reduce the width of at least said portion, masking at least a portion of the surface in the thus enlarged apertures with a material which is insoluble in an etchant which dissolves silicon dioxide, and, dissolving said portion of reduced width with buffered hydrofluoric acid to expose the underlying substrate surface, said exposed surface having a width substantially equal to the width of said portion of reduced width.

3. A method for exposing very narrow regions at the surface of a silicon semiconductor substrate having a protective silicon dioxide coating on the surface thereof comprising the steps of:

forming at least two apertures in said coating, the spacing therebetween being defined by a portion of said coating, undercutting at least said portion at the interface of said oxide and said substrate by exposing said substrate to a temperature in the range of 950°–1,000° C. in an atmosphere of gas selected from the group consisting of hydrogen and argon for a time sufficient to remove the silicon dioxide at its interface with said substrate to produce undercut regions in said portion adjacent the surface of said substrate and overhanging portions above said undercut regions, removing said overhanging portions of silicon dioxide by one of mechanically breaking said overhanging portions, subjecting said substrate to ultrasonic vibrations in liquid filled vessel, and selectively etching to remove only said overhanging portions to provide apertures larger than said original apertures and a coating portion smaller than said first mentioned coating portion, masking said larger apertures with nickel, and dissolving said smaller coating portion with buffered hydrofluoric acid to expose the underlying substrate surface, said exposed surface having a width substantially equal to the width of said smaller coating portion.

4. A method according to claim 1 wherein said metal oxide is silicon dioxide.

5. A method according to claim 1 wherein said masking material is nickel and said etchant is buffered hydrofluoric acid.

6. A method according to claim 1 wherein the step of removing said metal oxide region includes the step of, dissolving said oxide region in buffered hydrofluoric acid.

* * * * *